United States Patent [19]
Thompson

[11] Patent Number: 4,514,706
[45] Date of Patent: Apr. 30, 1985

[54] SECOND OR HIGHER ORDER PLL WITH INCREASED LOW AND MEDIUM FREQUENCY GAIN

[75] Inventor: William J. Thompson, Richardson, Tex.

[73] Assignee: Rockwell International Corporation, El Segundo, Calif.

[21] Appl. No.: 423,361

[22] Filed: Sep. 24, 1982

[51] Int. Cl.³ .............................................. H03L 7/06
[52] U.S. Cl. ...................................... 331/16; 331/17; 331/25
[58] Field of Search ............................ 331/16, 17, 25; 455/260; 375/120

[56] References Cited

U.S. PATENT DOCUMENTS 3,346,814 10/1967 Haggai ........................... 455/260 X
4,352,074 9/1982 Blinchikoff et al. .................. 331/17
4,435,847 3/1984 Williamson et al. ................ 455/260

FOREIGN PATENT DOCUMENTS 2087177 5/1982 United Kingdom .................. 331/17

Primary Examiner—Eugene R. LaRoche
Assistant Examiner—D. C. Mis
Attorney, Agent, or Firm—Richard A. Bachand; V. Lawrence Sewell; H. Fredrick Hamann

[57] ABSTRACT

A second or third-order phase-locked loop with higher loop gain at medium and low frequencies, while avoiding the problem of amplifier saturation caused by high amplifier gain combined with the DC offset of imperfect phase detectors, includes a voltage controlled oscillator and a phase detector for comparing the phase of the reference oscillator and the VCO. In a third-order embodiment, two operational amplifiers are connected in series between the output of the phase detector and the input to the VCO, each amplifier having an associated feedback circuit including a series capacitor and a resistor to provide gain shaping. A Tee circuit is provided from the output of one of the amplifiers to the input of the other, and includes a shunt-connected capacitor to provide low frequency sensitive feedback to reduce the gain of the amplifiers at frequencies approaching DC, thereby preventing saturation and enabling increased loop gain at frequencies thereabove.

15 Claims, 3 Drawing Figures

SECOND OR HIGHER ORDER PLL WITH INCREASED LOW AND MEDIUM FREQUENCY GAIN

BACKGROUND OF THE INVENTION

1. Field of the Invention

This invention relates to improvements in phase-locked loops, and more particularly to improvements in phase-locked loop circuitry in which the loop gain may be maximized while avoiding undesired performance degrading amplifier saturation in self sweeping and locking circuits.

2. Description of the Prior Art

Microwave communications systems commonly employ phase-locked oscillators to generate or detect RF signals. Commonly, a voltage controlled oscillator (VCO) is phase-locked to a crystal controlled reference oscillator. The output of the VCO supplies the output signal, and the entire phase-locked subsystem is referred to as an RF source. The phase-locked loop controlling the VCO has an effective loop bandwidth, and at frequencies above the loop bandwidth the FM noise of the source approaches that of the unlocked VCO. At frequencies below the loop bandwidth, the FM noise of the source approaches that of the reference oscillator.

Since the FM noise and frequency stability characteristics of the reference oscillator and VCO are different, the loop bandwidth is usually chosen for the best FM noise performance of the source. Generally, the VCO is more susceptible than the reference oscillator to frequency instabilities caused by mechanical shock, intermittent contact, temperature changes, and the like. The higher the loop gain, the more completely the VCO frequency can be locked to that of the reference oscillator at frequencies within the loop bandwidth. This higher loop gain, combined with the DC offset of the non-ideal phase detector, can cause the phase-locked loop amplifier to saturate at either minimum or maximum output voltage. The ideal phase detector has an output voltage directly proportional to the phase difference between the two signals. When the two oscillators are not phase locked (i.e. are operating on different frequencies) this phase difference constantly changes alternatively becoming positive and negative. For these unlocked oscillators, the long term average of the phase difference is zero, and as a result the long term average (DC) output voltage of an ideal phase detector would be zero. The non-ideal phase detector can have a DC output (offset) when it is driven by two unlocked oscillators. The loop amplifiers can also have DC offsets with effects similar to those caused by the DC offset of the phase detector.

In the prior art sources, an automatic sweep circuit is employed to sweep the VCO when the phase-locked loop is not locked. This type of sweep circuit works by applying frequency selective positive feedback around the phase-locked loop amplifier. When the phase-locked loop is locked, negative feedback appears from the output of the loop amplifier through the VCO and phase detector to the input of the loop amplifier. The negative feedback of the phase-locked loop overcomes the positive feedback of the sweep circuit, so the sweep oscillator does not operate when the loop is locked. On the other hand, when the loop is unlocked, the negative feedback goes away, and the positive feedback of the sweep circuit causes the loop amplifier to oscillate, sweeping the VCO over its full electronic tuning range. When the VCO frequency comes close to that of the reference oscillator, phase lock is reacquired.

If the DC offset of the phase detector combined with the high gain of the loop amplifier should cause the loop amplifier to saturate; however, it will prevent the sweep oscillator from oscillating. The reason for this is that the incremental gain of a saturated amplifier is very low and the loop gain of the sweep oscillator is inadequate to start the sweep oscillations.

In the prior art, this problem has forced the source designer to reduce his loop gain below optimum to continue to insure sweep circuit operation over the phase detector DC offset range.

As a related matter, reference is made to my copending U.S. Pat. application, Ser. No. 399,536, filed July 19, 1982, entitled PHASED-LOCKED LOOP WITH INCREASED LOW FREQUENCY GAIN, which is assigned to the assignee hereof, is incorporated herein by reference, and provides a third-order phase-locked loop wherein the gain rises at the rate of 18 dB per octave inside the loop bandwidth. This allows increased gain to be had, especially at the middle and higher end frequencies within the loop bandwidth. The problem now addressed is the enablement of a designer to use the higher gain in view of possible DC offsets which limit the amplifier gain which can be used at low frequencies without resulting in DC saturation of the amplifier.

SUMMARY OF THE INVENTION

In light of the above, it is an object of the invention to provide a circuit that permits maximum phase-locked loop gain while avoiding amplifier saturation, so that the sweep circuit will continue to operate over a reasonable range of phase detector DC offset.

It is another object of the invention to provide a phase-locked loop circuit which permits a higher gain over the upper frequencies of the lower part of the loop bandwidth, yet which does not become saturated at frequencies approaching DC.

These and other objects, features and advantages will become apparent to those skilled in the art from the following detailed description, when read in conjunction with the accompanying drawings and appended claims.

The present invention provides circuitry which has a rapidly falling gain at very low frequencies, approaching DC, to prevent amplifier saturation. This feature enables the loop to exhibit the benefits of high gain levels at medium and low frequencies, approaching DC, while avoiding amplifier saturation by DC offset.

The essence of the invention is the provision of a circuit that reduces loop amplifier gain at DC and very low frequencies. Since most of the noise and VCO irregularities causing system problems are in the medium and higher frequency range almost all of the advantages of higher loop gain are realized without the sweep circuit problems caused by loop amplifier saturation resulting from DC offset.

BRIEF DESCRIPTION OF THE DRAWING

The invention is illustrated in the accompanying drawing, in which.

DETAILED DESCRIPTION OF A PREFERRED EMBODIMENT

Figure 1:
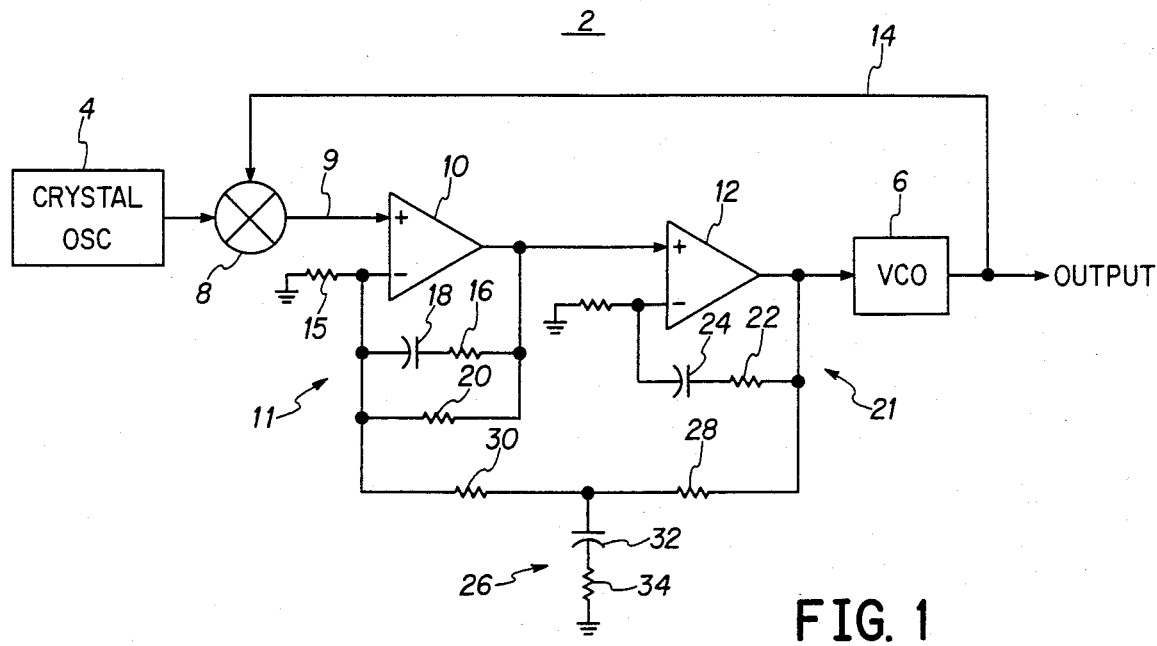
FIG. 1 is a schematic circuit diagram of a phase-locked loop, in accordance with the invention.

A preferred embodiment of the invention is shown in FIG. 1, in which a third-order phase-locked loop 2 provides increased gain at higher frequencies than that achieved heretofore with first or second order loops. It should be noted that although in a preferred embodiment a third-order circuit is shown, the principles of the invention equally apply to first and second order circuits, as well. The loop 2 includes a reference crystal oscillator 4 and a voltage controlled oscillator (VCO) 6. A phase detector 8, such as a mixer or the like, compares the phase of the reference oscillator 4 with the output of the VCO 6, and generates an output phase error, or difference signal, on the line 9 to first and second active amplifiers 10 and 12. Amplifiers 10 and 12 are connected in series between the output of the phase detector 8 and the frequency control input to the VCO 6, and serve to amplify and filter the phase error signal on the line 9 for delivery to the VCO 6, for compensatingly changing the frequency output of the VCO 6. The output of the VCO 6 is fed back via a return line 14 to the phase detector 8.

The amplifiers have associated high frequency gain shaping feedback means providing decreasing loop gain with increasing frequency at the rate of 18 dB per octave at frequencies approaching the loop bandwidth, as described in my above referenced copending patent application.

The amplifier 10 illustrated is an operational amplifier, and has its plus, or non-inverting, terminal connected to receive the output of the phase detector 8. The amplifier 10 also has an output connected to a feedback circuit 11 including a resistor 16 in series with a capacitor 18 to the minus, or inverting, terminal of the amplifier 10. Another resistor 20 is connected in parallel with the resistor 16 and the capacitor 18. In operation, at low frequencies, the capacitor 18 is nonconductive and the output of the amplifier 10 is fed back through the high valued resistor 20, affording only a small level of negative feedback to the inverting input of the amplifier 10 to produce a high level of amplification. As the frequency increases and the capacitor 18 becomes more conductive, a greater amount of feedback from the output of the amplifier 10 passes through the resistor 16 and the capacitor 18 to the inverting terminal, thus increasing the negative feedback, resulting in a lower gain level, or lower level of amplification.

A second operational amplifier 12 has its plus, or non-inverting, input connected to receive the output of the first amplifier 10. The second amplifier 12 has an output connected to the input of the VCO 6, and also to a feedback circuit 21, including a resistor 22 in series with a capacitor 24 to the minus, or inverting, input of the second amplifier 12.

A low frequency sensitive feedback circuit 26 operates to reduce the gain of the amplifiers at frequencies approaching DC to prevent saturation, enabling increased loop gain at frequencies thereabove. Thus, a Tee feedback network 26 includes resistors 28 and 30 connected in series between the output of the second amplifier 12 and the minus input of the first amplifier 10, and a capacitor 32 and resistor 34 in a series combination which is shunt-connected from the junction between resistors 28 and 30 to ground.

It should be noted that the embodiment shown, the Tee feedback circuit 26 is placed with the resistor 34 and capacitor 32 at a high impendance point in the circuit. This is significant because it enables the use of a smaller capacitive value for the capacitor 32, in relation to the associated resistor 34. The same effect can be achieved by placing the filter at other points in the circuit; it can be seen, for instance, that if the resistor 34 and capacitor 32 were placed in shunt with resistor 15 at a point of low impedance, such as the inverting terminal of the amplifier, 10 the same operation would be realized, but, a much larger capacitive value (perhaps as much as 50 times) would be needed.

Figure 2:
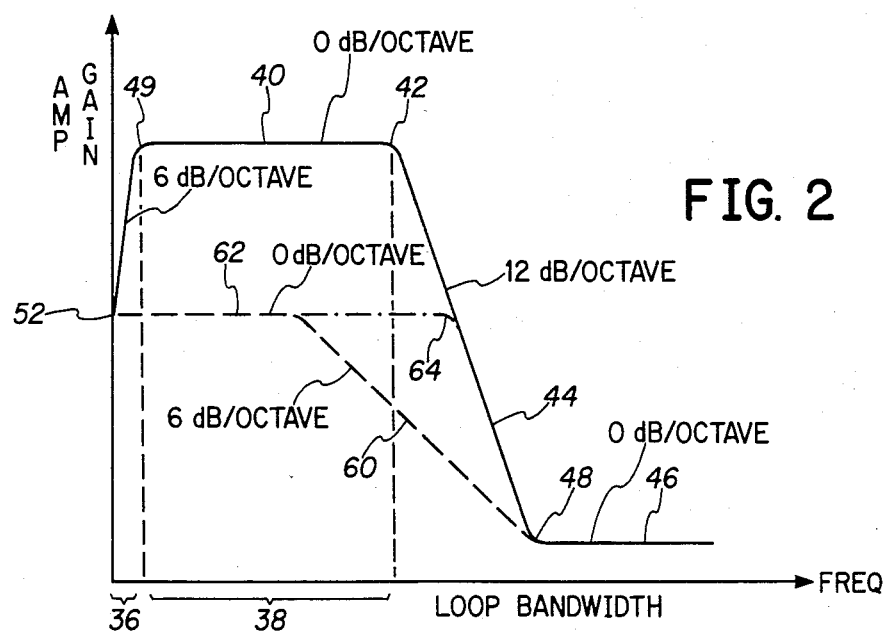
FIG. 2 is a graph of frequency vs. amplifier gain, showing an increased plateau amplifier gain level of the present invention (solid line) contrasted against a second-order loop amplifier gain function (dashed line) and against the prior art lower plateau amplifier gain level (dot-dashed line).
Figure 3:
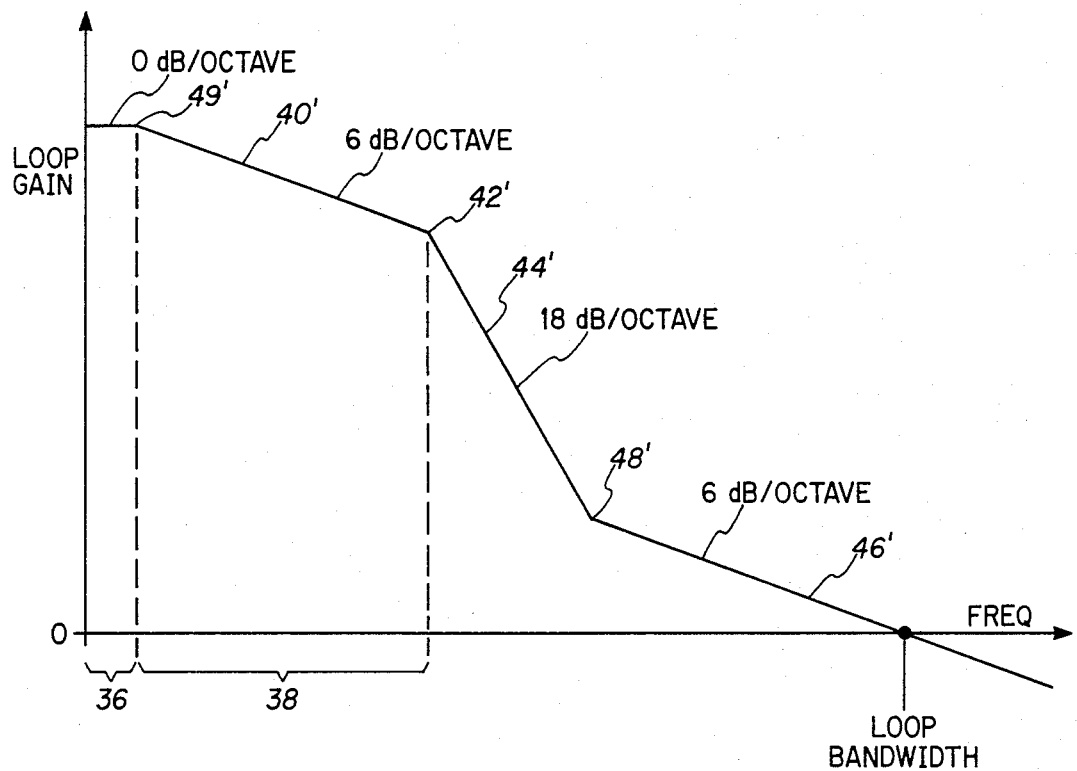
FIG. 3 is a graph of frequency vs. loop gain, showing an overall increase in loop gain over the lower frequency portion of the loop bandwidth.

In operation, with reference now to FIGS. 2 and 3, which respectively show amplifier and loop gain of the circuit 2 as a function of frequency, at an extremely low frequency range 36 approaching DC, the capacitor 32 is nonconductive and the output from the amplifier 12 is fed back through the resistors 28 and 30 to the minus input of the amplifier 10, thus reducing the gain of the two amplifiers 10 and 12. As the frequency increases into the intermediate bandwidth frequency range 38, the capacitor 32 becomes conductive and diverts some of the negative feedback through the resistor 34, thus reducing the amount of overall negative feedback to the amplifier 10, and affording an overall increased gain level. Also, in the frequency range 38, the capacitor 24 is nonconductive, causing the output of the amplifier 12 to be fed through resistor 28. As the frequency increases, the capacitor 24 becomes more conductive and enables a larger amount of negative feedback through the smaller valued resistor 22 to the minus terminal of the amplifier 12 to reduce its gain. Likewise, with increasing frequency the capacitor 18 becomes more conductive and enables a larger amount of negative feedback through the smaller valued resistor 16 to the minus terminal of the amplifier 10 to reduce its gain. Thus, the feedback networks 11 and 21 associated with the amplifiers 10 and 12 cause the gain of the cascaded amplifiers 10 and 12 to rise at frequencies below frequency 48, and the Tee feedback network 26 limits this rise in gain at frequencies below 42.

With reference now to FIG. 3, the intrinsic loop gain function at the transition frequencies is 6 dB per octave. Each amplifier stage 10 and 12 adds another 6 dB per octave to the transition slope, resulting in a cumulative frequency roll-off slope of 18 dB per octave. The frequency sensitive feedback circuitry establishes the loop gain at 0 dB per octave at the near DC region 36, and at a fall off rate of 6 dB per octave along portion 40' at frequencies below a first corner frequency 42. The loop gain then falls along slope 44' at the rate of 18 dB per octave at frequencies above the corner frequency 42'. The loop gain again then falls off at 6 dB per octave along the portion 46' of the curve above a second corner frequency 48', approaching the loop bandwidth.

It is thus seen that as the frequency decreases within the loop bandwidth, the loop gain rises rapidly at the rate of 18 dB per octave within the loop bandwidth, to an increased loop gain at break point 42', and at the rate of 6 dB per octave to the break point 49', thus achieving an overall increased low frequency gain. This is achieved by the feedback means which sets the amplifier gain at a given plateau level 40 over frequency range 38, i.e. at frequencies above a DC approaching frequency range 36 and below the first corner frequency point at the corner 42 (see FIG. 2). Thus, at corner frequency 49, the impedance of the capacitor 32 becomes significant with respect to the resistor 34, thereby increasing the overall negative feedback and reducing the overall amplifier gain to the lower level 52, determined by the resistors 15, 30 and 28.

In contrast a 6 dB per octave slope afforded by prior art circuits rises at a slower rate and does not reach as quickly the high gain levels afforded by the present invention, as shown by the dashed line 60, rising to a plateau gain level 62. My above referenced copending patent application provides a steeper 12 dB per octave slope which follows the slope 44, and which plateaus at a gain level 62 at the corner frequency 64, as shown by the dot-dash line, because the greater gain, combined with DC offset, resulted in amplifier saturation. It is seen that the steeper slope provides higher gain at the higher end frequencies within the loop bandwidth.

In the present invention, furthermore, it is seen that the loop gain rising at the rate of 18 dB per octave along slope 44' is not plateaued at a frequency corresponding to amplifier gain level 62, but rather, the loop gain is allowed to continue up to the frequency 42'. As seen, the corresponding amplifier gain plateau 40 provides a higher gain level than the plateau 62 of the prior art circuits at the lower frequencies within the loop bandwidth. As noted, the gain falls rapidly in the DC approaching frequency range 36 because of the operation of the Tee feedback network 26, preventing saturation, and enabling an increase in plateau gain to be afforded over the frequency range between the DC approaching frequency range 36 and the frequency at the corner 64. Without the Tee feedback network 26, the loop gain over the DC approaching frequency range would otherwise be limited to the lower level 62.

Although the invention has been described and illustrated with a certain degree of particularity, it is understood that the present disclosure has been made by way of example only and that numerous changes in the combination or arrangement of parts may be resorted to by those skilled in the art without departing from the spirit and scope of the invention as hereinafter claimed.

I claim:

1. A phase-locked loop comprising:
    a reference oscillator,
    a voltage controlled oscillator (VCO),
    a phase detector for comparing the phases of the output signals of said reference oscillator and said VCO, and
    an amplifier circuit connected between an output of said phase detector and a frequency controlling input of the VCO, said circuit having a forward signal path, including an amplifier, from said phase detector output to said VCO intput, and said circuit having a gain at frequencies approaching DC which is reduced from the maximum gain of the circuit so as to prevent saturation at said frequencies approaching DC.

2. The phase-locked loop of claim 1 wherein said amplifier circuit includes feedback means, connected in feedback relation to said amplifier in said forward signal path, for providing said reduced gain.

3. The phase-locked loop of claim 2 wherein said amplifier circuit comprises two amplifiers, in series.

4. The phase-locked loop of claim 3 wherein said feedback means comprises a first feedback circuit, including a Tee circuit, around at least one of said amplifiers.

5. The phase-locked loop of claim 4 wherein said feedback means further comprises second and third feedback circuits, each associated with a respective one of said amplifiers.

6. The phase-locked loop of claim 5 wherein said second and third feedback circuits each comprise a series capacitor which becomes increasingly conductive with increasing frequency to provide a high frequency roll-off of 18 db per octave, and wherein said first feedback circuit is connected around both said amplifiers and comprises, in the center branch of the Tee circuit, a parallel capacitor which diverts feedback current at high frequencies to increase negative feedback in a range of frequencies approaching DC.

7. The phase-locked loop of claim 2, wherein said feedback means includes a Tee circuit connected in feedback relation to said amplifier.

8. A phase-locked loop providing an increased gain capability, comprising:
    a reference oscillator,
    a voltage controlled oscillator (VCO),
    a phase detector for comparing the phases of the output signals of said reference oscillator and said VCO,
    an amplifier circuit connected to form a signal path, including an amplifier, between the output of said phase detector and the input of the VCO, said amplifier having low frequency-sensitive feedback means for reducing, at frequencies approaching DC, the gain of said amplifier below its maximum gain, so as to prevent saturation of the amplifier at said frequencies approaching DC.

9. The phase-locked loop according to claim 8, wherein said phase-locked loop is a third-order loop.

10. The phase-locked loop of claim 9 wherein said signal path includes two amplifiers in series.

11. The invention according to claim 10 wherein said amplifiers have high frequency sensitive loop gain shaping feedback means effective at frequencies above a given corner frequency and approaching a loop bandwidth for providing decreasing loop gain with increasing frequency.

12. The invention of claim 11 wherein said feedback means establish the loop gain at a given plateau at frequencies at and immediately above said frequencies approaching DC, said loop gain falling at a rate of 6 db per octave at frequencies above a first corner frequency, falling at a rate of 18 db per octave above a second corner frequency, and falling at a rate of 6 db per octave above a third corner frequency where frequencies are approaching said loop bandwidth.

13. The invention of claim 12 wherein said low frequency-sensitive feedback means is connected between the output of said second amplifier and a first input of said first amplifier and comprises a Tee feedback network having a capacitor connected in shunt to ground.

14. The invention of claim 13 wherein said Tee feedback network comprises a pair of resistors connected in series between the output of said second amplifier and said first input of said first amplifier, and another resistor connected in series with said capacitor.

15. The invention of claim 14 wherein:
    said first amplifier has a second input connected to said output of said phase detector and an output connected in a feedback circuit, forming a part of said high frequency-sensitive loop gain-shaping feedback means, including a capacitor to said first input of said first amplifier;

said second amplifier has a first input connected to said output of said first amplifier, and an output connected to said input to said VCO and connected in a feedback circuit, forming a part of said high frequency-sensitive loop gain-shaping feedback means, and including a capacitor to a second input of said second amplifier; and a resistor connected between said output of said first amplifier and said first input of said first amplifier in parallel with said associated capacitor.

* * * * *